(12) United States Patent
Xiaochun

(10) Patent No.: US 7,786,555 B2
(45) Date of Patent: Aug. 31, 2010

(54) SEMICONDUCTOR DEVICES WITH MULTIPLE HEAT SINKS

(75) Inventor: Tan Xiaochun, Shanghai (CN)

(73) Assignee: Diodes, Incorporated, Dallas, TX (US)

( * ) Notice: Subject to any disclaimer, the term of this patent is extended or adjusted under 35 U.S.C. 154(b) by 588 days.

(21) Appl. No.: 11/256,328

(22) Filed: Oct. 20, 2005

(65) Prior Publication Data

US 2007/0090463 A1   Apr. 26, 2007

(51) Int. Cl.
*H01L 23/495* (2006.01)
*H01L 23/34* (2006.01)

(52) U.S. Cl. .................. 257/675; 257/666; 257/713; 257/787; 257/E23.051

(58) Field of Classification Search ............... 257/675, 257/666, 713, 787, E23.051
See application file for complete search history.

(56) References Cited

U.S. PATENT DOCUMENTS

| | | | |
|---|---|---|---|
| 4,803,545 A | 2/1989 | Birkle | |
| 5,350,713 A | 9/1994 | Liang | |
| 5,625,226 A * | 4/1997 | Kinzer | 257/705 |
| 5,834,842 A | 11/1998 | Majumdar et al. | |
| 6,256,200 B1 * | 7/2001 | Lam et al. | 361/704 |
| 6,351,034 B1 | 2/2002 | Farnworth et al. | |
| 6,396,127 B1 | 5/2002 | Munoz et al. | |
| 6,521,982 B1 * | 2/2003 | Crowley et al. | 257/676 |
| 6,587,344 B1 | 7/2003 | Ross | |
| 6,608,373 B2 | 8/2003 | Wu et al. | |
| 6,707,138 B2 * | 3/2004 | Crowley et al. | 257/676 |
| 6,777,800 B2 * | 8/2004 | Madrid et al. | 257/690 |
| 6,891,265 B2 * | 5/2005 | Mamitsu et al. | 257/718 |
| 2001/0045644 A1 * | 11/2001 | Huang | 257/718 |
| 2007/0045785 A1 * | 3/2007 | Noquil | 257/666 |

OTHER PUBLICATIONS

Kandarp Pandya, Polarpak Solder Joint Reliability Based on Thermal Fatigue IPC-9701, Vishay Siliconix, Aug. 31, 2005, pp. 1-17.
Kandarp Pandya, Development of a Lead (PB)- Free Soldering Process for Polarpak, Vishay Siliconix, Aug. 31, 2005, pp. 1-7.
Spice Device Model SiE802DF, Vishay Siliconix, N- Channel 30-V (D-S) MOSFET, Jun. 20, 2005, pp. 1-3.
SiE802DF, Vishay Silconix, N- Channel 30-V (D-S) MOSFET, Oct. 24, 2005, pp. 1-7.
Package Information, Vishay Siliconix, Jun. 10, 2005, pp. 1-2.
Reel Information, Vishay Siliconix, Sep. 19, 2005, pp. 1-2.
Device Orientation, Vishay Siliconix, Device Orientation PolarPak, 1 Page.
Tape Information, Vishay Siliconix, Oct. 10, 2005, 1 page.

* cited by examiner

*Primary Examiner*—Nitin Parekh
(74) *Attorney, Agent, or Firm*—Courtney Staniford & Gregory LLP

(57) ABSTRACT

A semiconductor device that includes multiple heat sinks is provided along with methods for forming a semiconductor device having multiple heat sinks. The semiconductor device includes a first heat sink that is configured as a conductive lead frame. The conductive lead frame is electrically coupled to a conducting area of a semiconductor die. The semiconductor device also includes a second heat sink that is configured as a conductive clip. The conductive clip is electrically coupled to another conducting area of the die. Alternative embodiments of the device may include more than two heat sinks.

14 Claims, 10 Drawing Sheets

US 7,786,555 B2

SEMICONDUCTOR DEVICES WITH MULTIPLE HEAT SINKS

TECHNICAL FIELD

The present embodiments relate generally to the field of semiconductor devices and, more particularly, to semiconductor devices that include dual heat sinks.

BACKGROUND

Rapid growth in the electrical industry has produced a need for electrical devices that are smaller in size but that operate in high-power architectures to support multiple features/functions. A high-power device generally supports relatively higher currents and consequently higher power, which requires the device to have efficient heat dissipation capability. While heat sinks have typically been used in electronic devices as a means for facilitating heat dissipation, surface-mount discrete power semiconductor devices typically include no heat sink or a single heat sink because of the size constraints of these devices. A high-power device having no heat sink or only a single heat sink may not adequately dissipate heat from a high-power device, so there is a need for semiconductor devices that include more than a single heat sink.

Each publication and/or patent application mentioned in this specification is herein incorporated by reference in its entirety to the same extent as if each individual publication and/or patent application was specifically and individually indicated to be incorporated by reference.

DETAILED DESCRIPTION

A semiconductor device or "device" is provided that includes a semiconductor die coupled to multiple heat sinks. The device of an embodiment includes a first heat sink configured as a conductive lead frame that is electrically coupled to a conducting area of a die. The device also includes a second heat sink configured as a conductive clip that is electrically coupled to another conducting area of the die. Alternative embodiments of the device may include more than two heat sinks.

The following description provides specific details for a thorough understanding of, and enabling description for, embodiments of a semiconductor device that includes multiple heat sinks along with the corresponding processes for device formation. However, one skilled in the art will understand that the devices and processes described herein may be practiced without these details. In other instances, well-known structures and functions have not been shown or described in detail to avoid unnecessarily obscuring the description of the embodiments described herein.

Figure 1:
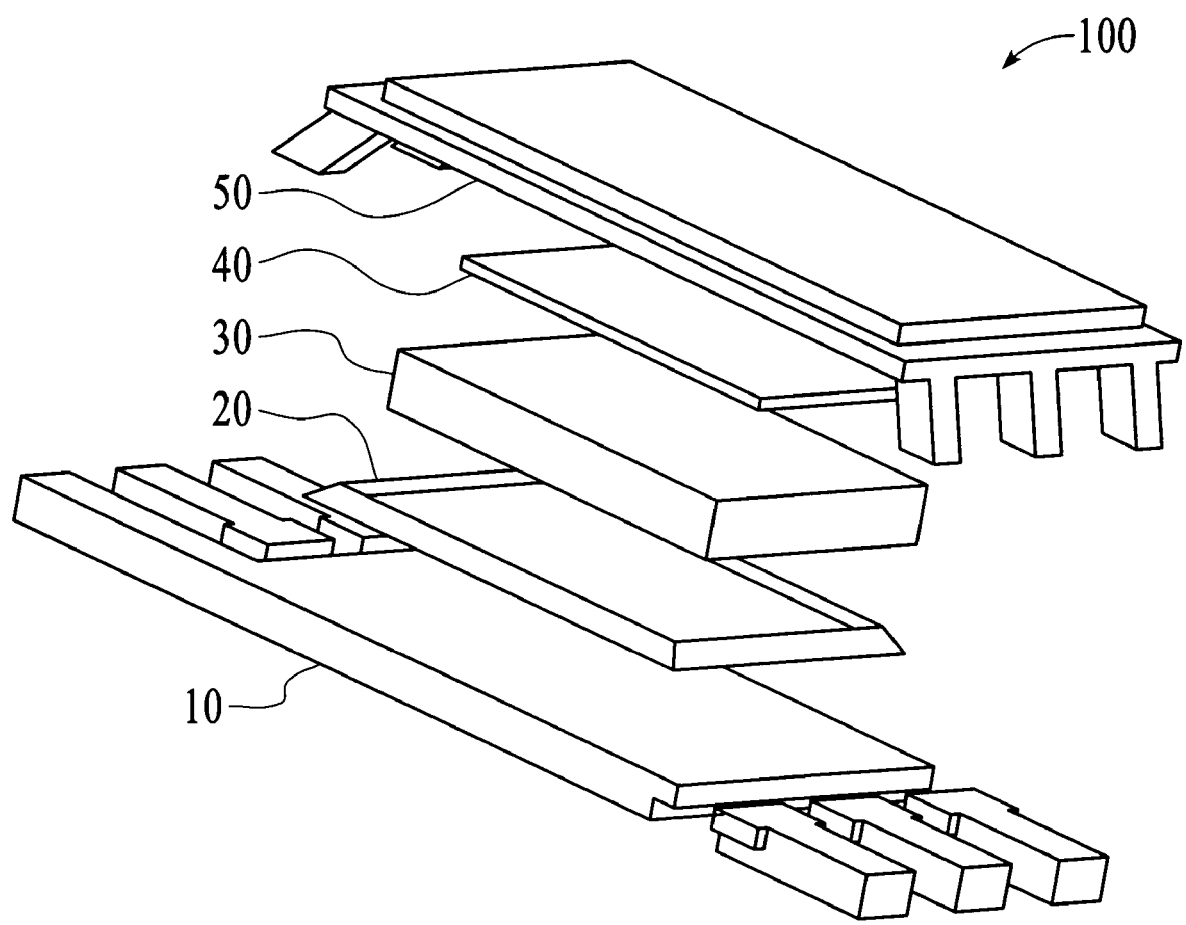
FIG. 1 is an exploded view of a semiconductor device that includes multiple heat sinks, under an embodiment.

FIG. 1 is an exploded view of a semiconductor device 100 that includes dual heat sinks 10 and 50, under an embodiment. The device 100 includes but is not limited to a first heat sink 10, a first region or layer of conductive solder 20, a semiconductor die 30, a second region or layer of conductive solder 40, and a second heat sink 50. Each of the first heat sink 10 and second heat sink 50 comprise a conductive material or a combination of materials some of which are conductive as appropriate to the device. The first heat sink 10 of an embodiment is configured as a conductive mounting platform 10 (also referred to as "lower heat sink 10" or "bottom heat sink 10"). The second heat sink 50 of an embodiment is configured as a conductive clip 50 (also referred to as "upper heat sink 50" or "top heat sink 50"). While the device formation processes of an embodiment use solder 20 and 40 to join the die 30 to the other components of the device 100, alternative embodiments may use other compounds to join the die 30 to the other components of the device 100 as appropriate to the process and/or device 100.

Alternative embodiments of the device may include more than two heat sinks but are not so limited. For example, the top heat sink of an alternative embodiment may be formed from two or more different heat sinks. Similarly, the bottom heat sink of an alternative embodiment may be formed from two or more different heat sinks.

Figure 2:
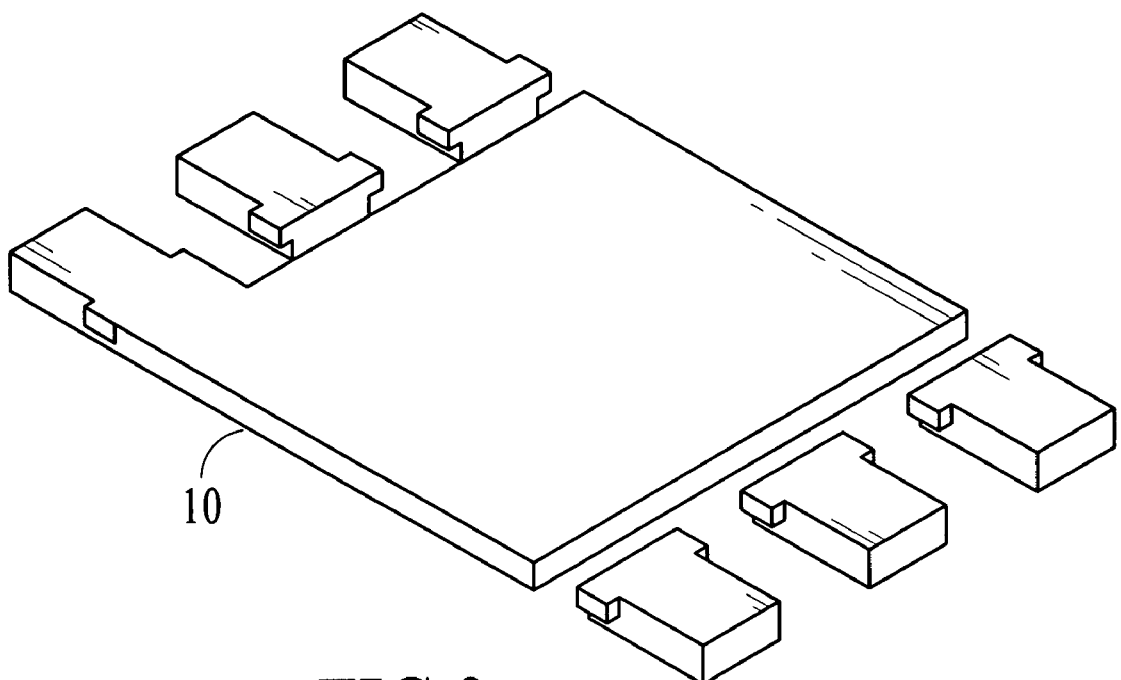
FIG. 2 is a perspective view of a bottom heat sink of a device, under an embodiment.

FIG. 2 is a perspective view of a bottom heat sink 10 of the device 100, under an embodiment. The bottom heat sink 10 couples to a lead frame structure (not shown) and serves as a conductive mounting platform that receives the die 30 of a device 100. Solder 20 is mounted or applied to one or more regions or areas of the bottom heat sink 10, and a first surface of a semiconductor die 30 is mounted or coupled to the bottom heat sink 10 using the solder 20. The first surface of the die 30 of an embodiment is a bottom surface, but the embodiment is not so limited. The bottom surface may be either of an anode or cathode of the die 30 as appropriate to the configuration of the device 100 and/or the top surface of the die 30.

Figure 3:
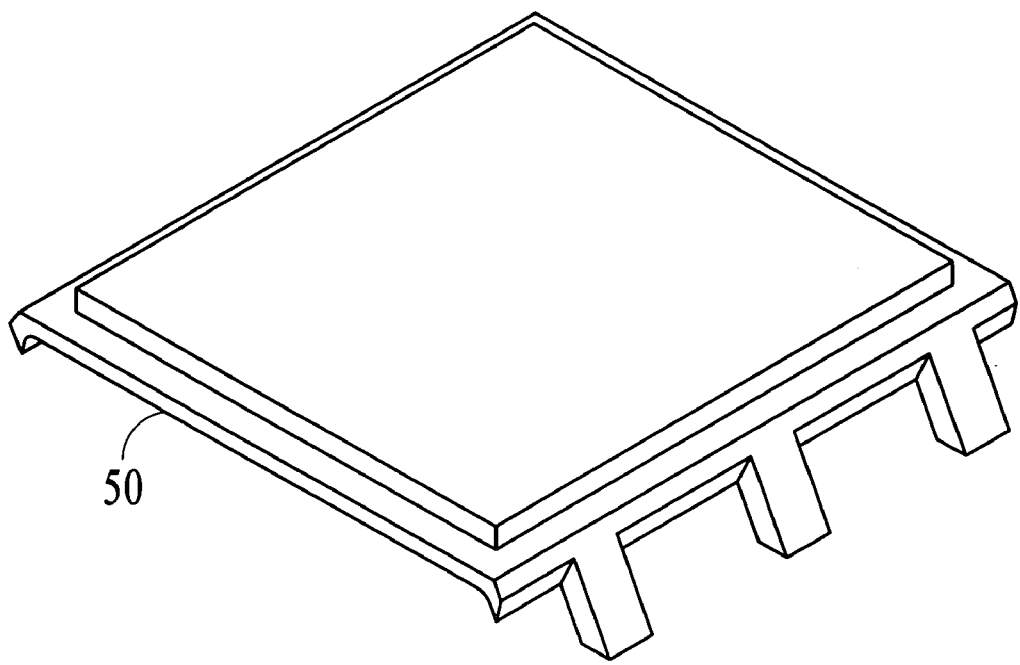
FIG. 3 is a perspective view of a top heat sink of a device, under an embodiment.

FIG. 3 is a perspective view of a top heat sink 50 of a device 100, under an embodiment. The top heat sink 50 couples or connects the die 30 to the lead of the lead frame structure (not shown). Consequently, solder 40 is mounted or applied to one or more regions or areas of a second surface of the die 30, and the top heat sink 50 is mounted or coupled to the die 30 using the solder 40. The second surface of the die 30 of an embodiment is a top surface, but the embodiment is not so limited. The top surface may be either of an anode or cathode of the die 30 as appropriate to the configuration of the device 100 and/or the bottom surface of the die 30.

Figure 4:
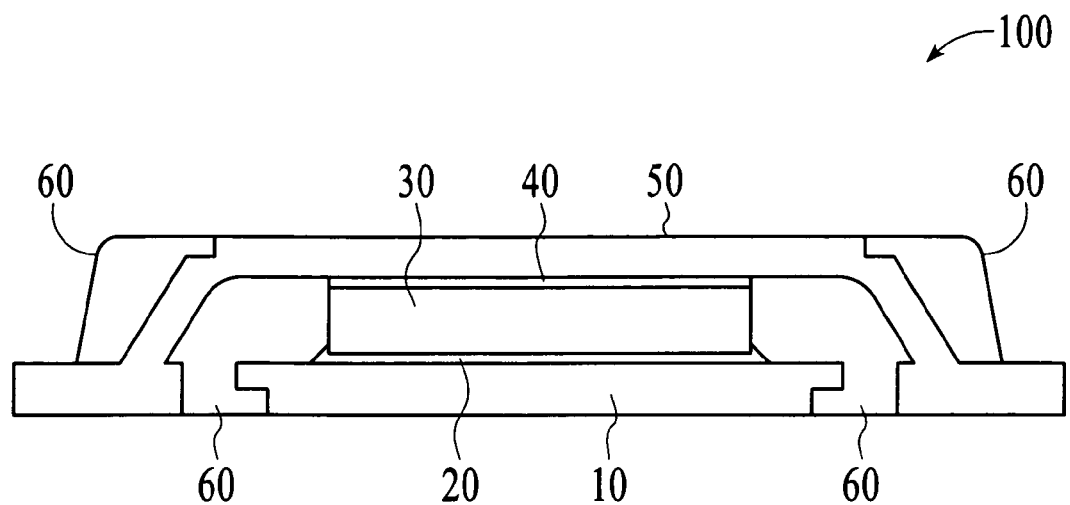
FIG. 4 is a cross-sectional view of a device that includes multiple heat sinks, under an embodiment.

FIG. 4 is a cross-sectional view of a device 100 that includes dual heat sinks 10 and 50, under an embodiment. As described above with reference to FIG. 1, the device 100 includes but is not limited to a bottom heat sink 10 (conductive mounting platform 10), a first region or layer of conductive solder 20, a semiconductor die 30, a second region or layer of conductive solder 40, and a top heat sink 50 (conductive clip 50). Further, the device 100 is encapsulated in a compound 60 that can include epoxy compounds and the like. Each of the bottom heat sink 10 and top heat sink 50 comprise a conductive material or a combination of materials some of which are conductive as appropriate to the device. The bottom heat sink 10 of an embodiment is configured as a conductive mounting platform 10, while the top heat sink 50 of an embodiment is configured as a conductive clip 50.

Figure 5A:
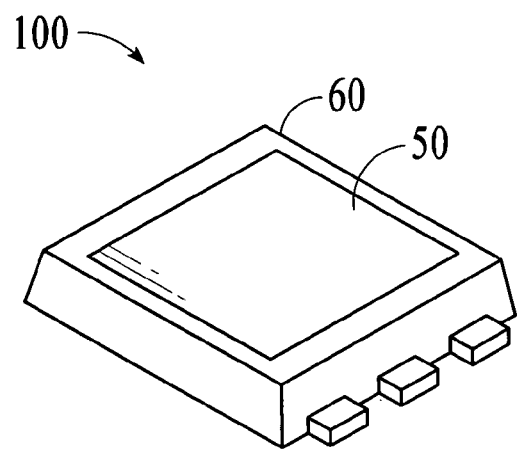
FIG. 5A is a top perspective view of a device that includes multiple heat sinks, under an embodiment.

FIG. 5A is a top perspective view of a device 100 that includes dual heat sinks, under an embodiment. The device is encapsulated in a compound 60 and includes, among other components, a top heat sink 50, as described above with reference to FIG. 1 and FIG. 4.

Figure 5B:
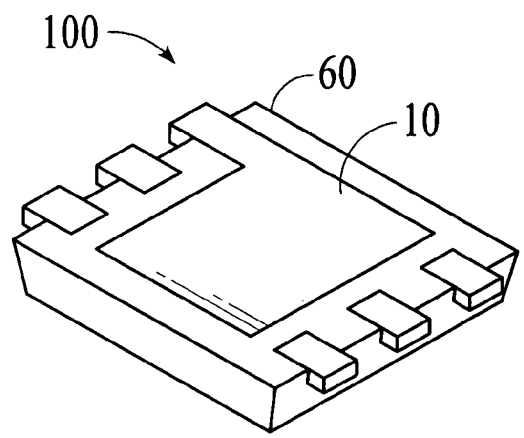
FIG. 5B is a bottom perspective view of a device that includes multiple heat sinks, under an embodiment.

FIG. 5B is a bottom perspective view of a device 100 that includes dual heat sinks, under an embodiment. The device is encapsulated in a compound 60 and includes, among other components, a bottom heat sink 10, as described above with reference to FIG. 1 and FIG. 4.

Figure 6:
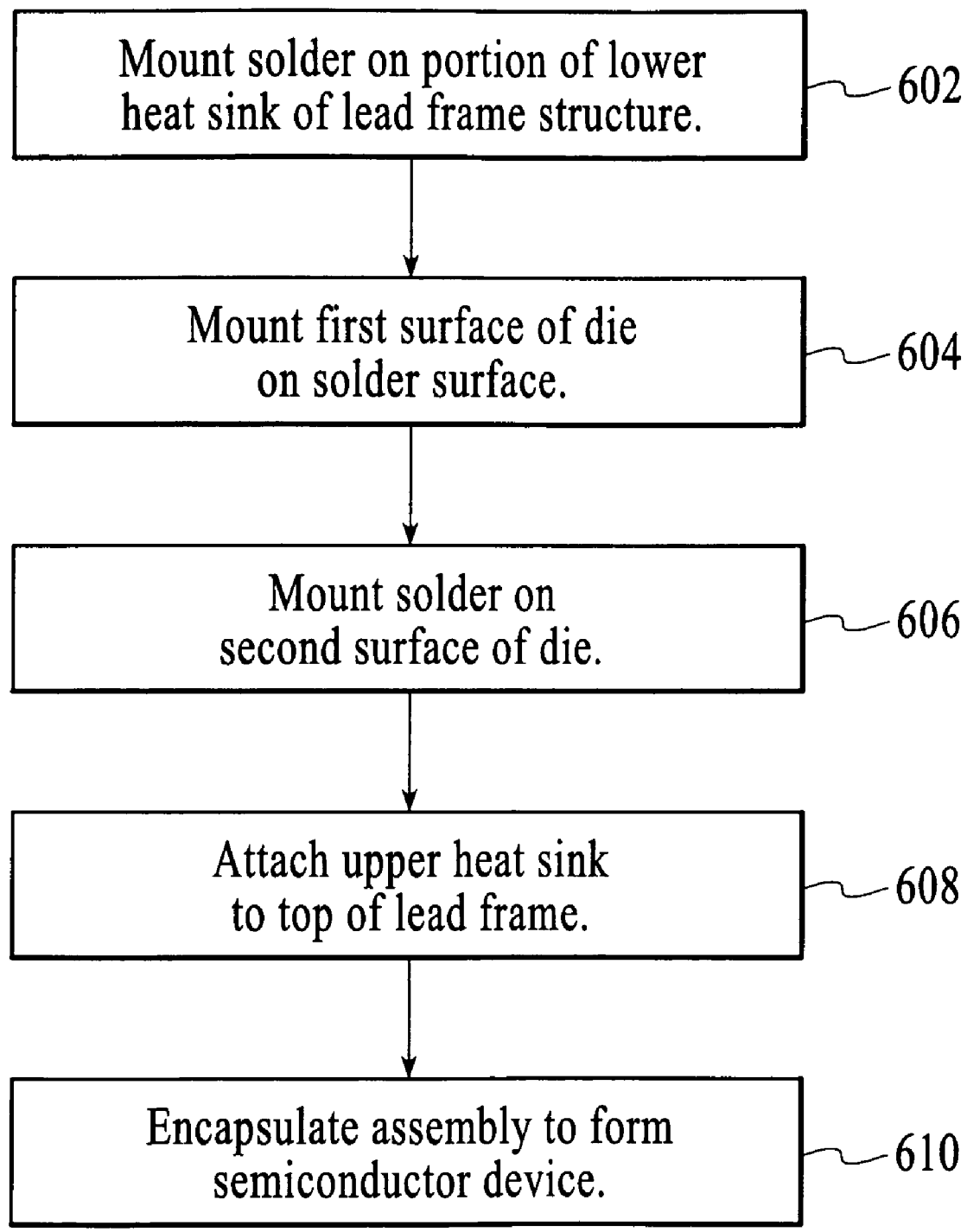
FIG. 6 is a flow diagram for forming a semiconductor device to include multiple heat sinks, under an embodiment.

FIG. 6 is a flow diagram 600 for forming a semiconductor device that includes multiple heat sinks, under an embodiment. The semiconductor device formation 600 includes mounting or applying 602 solder on one or more portions of a bottom heat sink in preparation for die attachment. The bottom heat sink is configured as a conductive mounting platform but is not so limited.

The semiconductor device formation 600 further includes mounting 604 a first surface of a semiconductor die on the solder surface. The first surface of an embodiment is a bottom surface of the die, but the embodiment is not so limited. The bottom surface may be either of an anode or cathode of the die as appropriate to the device and the configuration of the top surface of the die. This mounting 604 forms an electrical connection between a portion of the surface of the bottom heat sink and the die.

The semiconductor device formation 600 further includes mounting or applying 606 solder to a second surface of the die. The second surface of an embodiment is a top surface of the die, but the embodiment is not so limited. The top surface may be either of an anode or cathode of the die as appropriate to the device and the configuration of the bottom surface of the die.

The semiconductor device formation 600 further includes mounting or attaching 608 a top heat sink to the solder on the second surface of the die. This mounting 608 forms an electrical connection between a portion of the surface of the top heat sink and the die. Consequently, the combination of the bottom heat sink (e.g., conductive mounting platform), the die, and the top heat sink (e.g., conductive clip), along with the solder, forms an electrically conductive path between the die and each of the top and bottom heat sinks, but the embodiment is not so limited.

The semiconductor device formation 600 further includes forming 610 a packaging enclosure around the components of the semiconductor device. Forming the enclosure includes encapsulating or encasing the bottom heat sink, solder, die, and top heat sink in an epoxy or other suitable compound as appropriate to the device and using processes as appropriate to the device. Following formation of the packaging enclosure, the device is separated from the lead frame structure.

Figure 7:
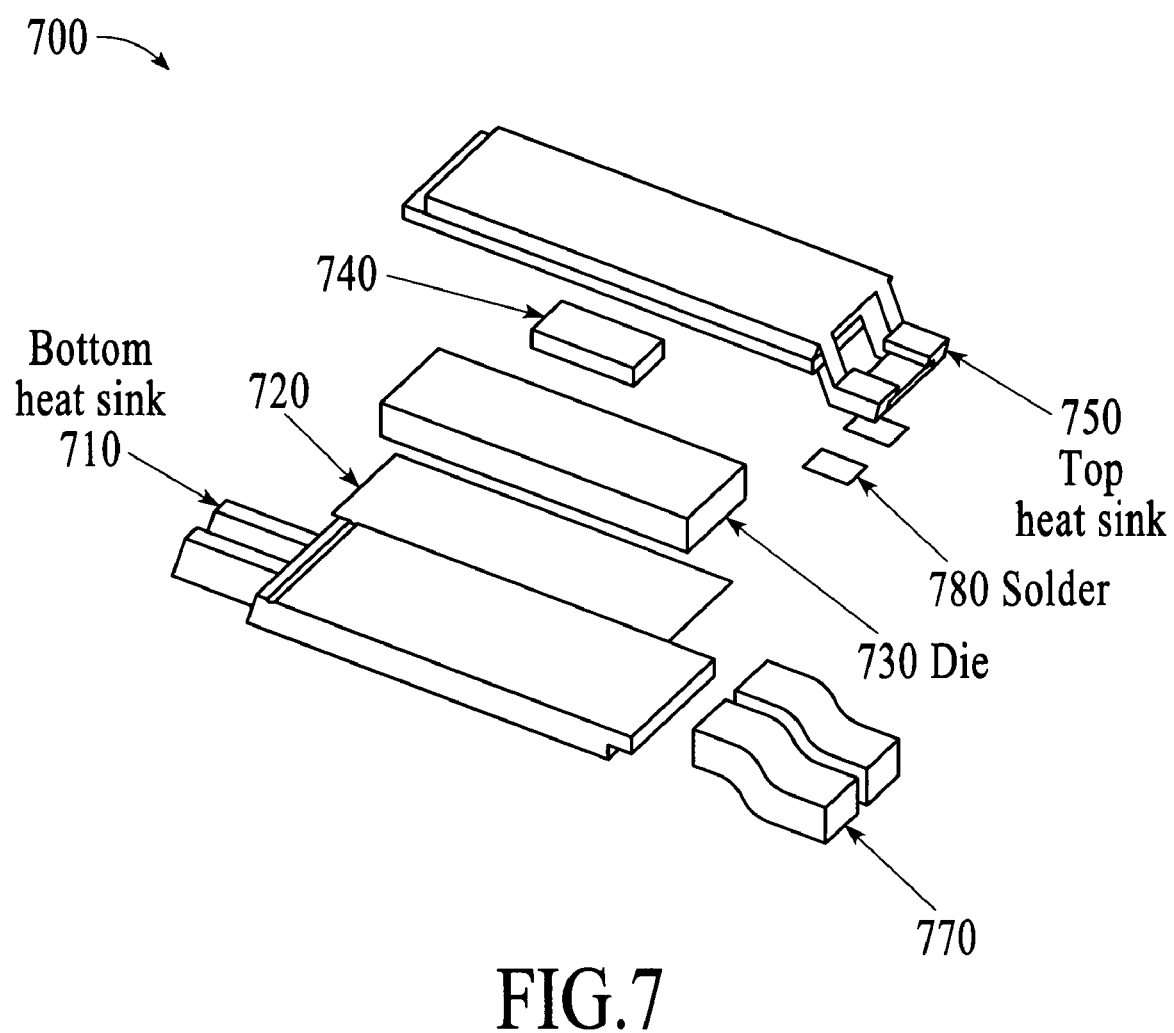
FIG. 7 is an exploded view of a semiconductor device that includes dual heat sinks, under an alternative embodiment.

FIG. 7 is an exploded view of a semiconductor device 700 that includes dual heat sinks 710 and 750, under an alternative embodiment. The device 700 includes but is not limited to a first heat sink 710, a first region or layer of conductive solder 720, a semiconductor die 730, a second region or layer of conductive solder 740, and a second heat sink 750. Each of the first heat sink 710 and second heat sink 750 comprise a conductive material or a combination of materials some of which are conductive as appropriate to the device. The first heat sink 710 of an embodiment is configured as a conductive mounting platform 710 (also referred to as "lower heat sink 710" or "bottom heat sink 710"). The second heat sink 750 of an embodiment is configured as a conductive clip 750 (also referred to as "upper heat sink 750" or "top heat sink 750"). The second heat sink 750 is coupled to one or more conductive leads 770 using solder 780 but is not so limited. While the device formation processes of an embodiment use solder 720/740/780 to join or connect various components of the device 700, alternative embodiments may use other compounds to join the components of the device 700 as appropriate to the process and/or device 700.

Alternative embodiments of the device may include more than two heat sinks but are not so limited. For example, the top heat sink of an alternative embodiment may be formed from two or more different heat sinks. Similarly, the bottom heat sink of an alternative embodiment may be formed from two or more different heat sinks.

Figure 8:
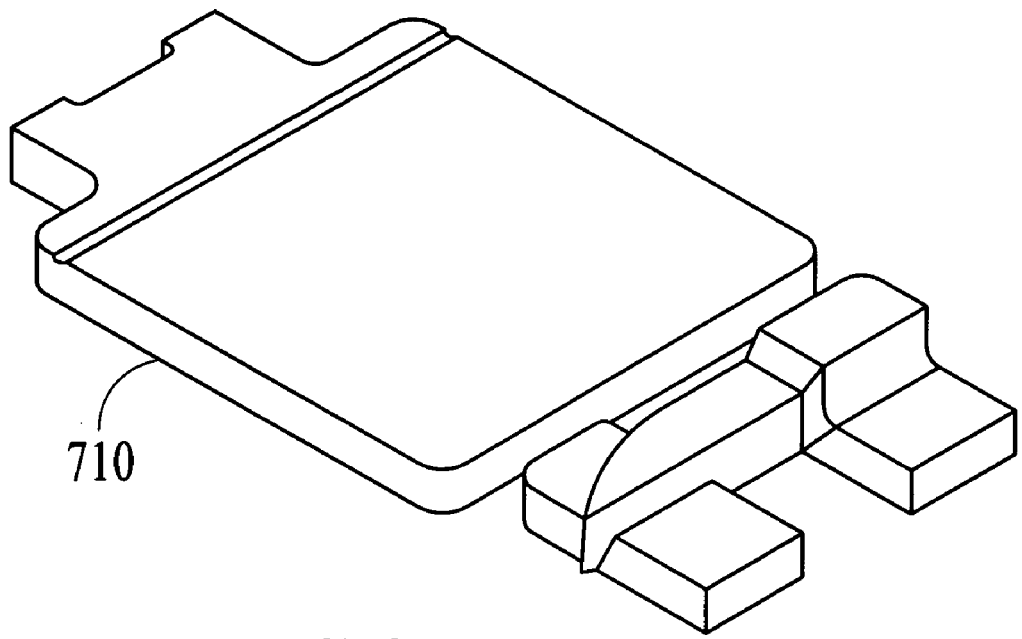
FIG. 8 is a perspective view of a bottom heat sink of the device, under an alternative embodiment.

FIG. 8 is a perspective view of a bottom heat sink 710 of the device 700, under an alternative embodiment. The bottom heat sink 710 couples to a lead frame structure (not shown) and serves as a conductive mounting platform that receives the die 730 of a device 700. Solder 720 is mounted or applied to one or more regions or areas of the bottom heat sink 710, and a first surface of a semiconductor die 730 is mounted or coupled to the bottom heat sink 710 using the solder 720. The first surface of the die 730 of an embodiment is a bottom surface, but the embodiment is not so limited. The bottom surface may be either of an anode or cathode of the die 730 as appropriate to the configuration of the device 700 and/or the top surface of the die 730.

Figure 9:
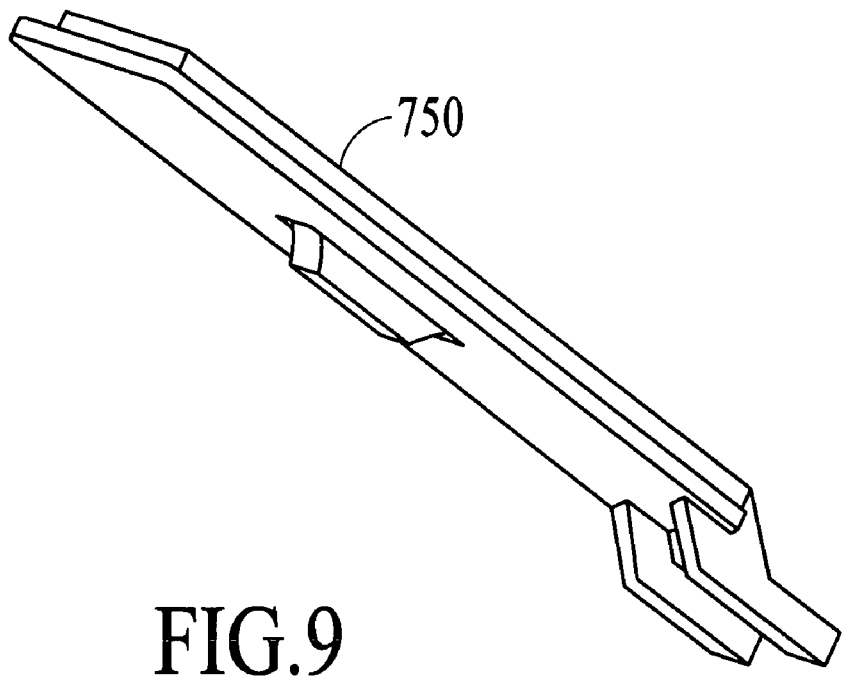
FIG. 9 is a perspective view of a top heat sink of a device, under an alternative embodiment.

FIG. 9 is a perspective view of a top heat sink 750 of a device 700, under an alternative embodiment. The top heat sink 750 couples or connects the die 730 to the lead of the lead frame structure (not shown). Consequently, solder 740 is mounted or applied to one or more regions or areas of a second surface of the die 730, and the top heat sink 750 is mounted or coupled to the die 730 using the solder 740. The second surface of the die 730 of an embodiment is a top surface, but the embodiment is not so limited. The top surface may be either of an anode or cathode of the die 730 as appropriate to the configuration of the device 700 and/or the bottom surface of the die 730.

Figure 10:
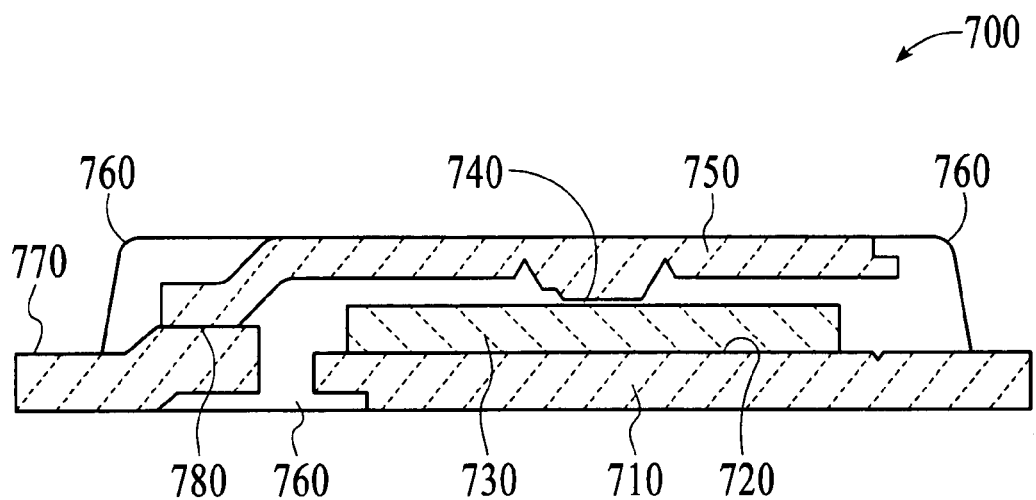
FIG. 10 is a cross-sectional view of a device that includes dual heat sinks, under an alternative embodiment.

FIG. 10 is a cross-sectional view of a device 700 that includes dual heat sinks 710 and 750, under an alternative embodiment. As described above with reference to FIG. 7, the device 700 includes but is not limited to a bottom heat sink 710 (conductive mounting platform 710), a first region or layer of conductive solder 720, a semiconductor die 730, a second region or layer of conductive solder 740, and a top heat sink 750 (conductive clip 750). Further, the device 700 is encapsulated in a compound 760 that can include epoxy compounds and the like. Each of the bottom heat sink 710 and top heat sink 750 comprise a conductive material or a combination of materials some of which are conductive as appropriate to the device. The bottom heat sink 710 of an embodiment is configured as a conductive mounting platform 710, while the top heat sink 750 of an embodiment is configured as a conductive clip 750.

Figure 11A:
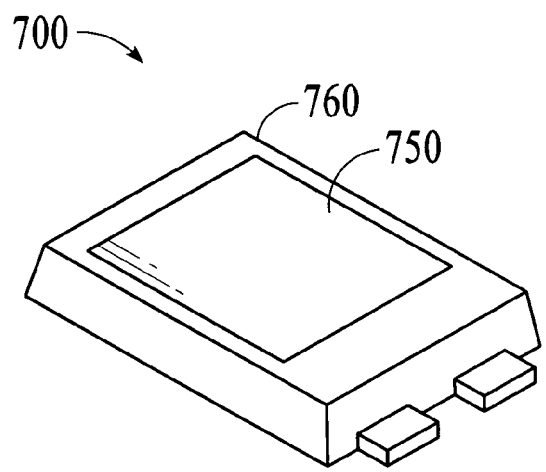
FIG. 11A is a top perspective view of a device that includes dual heat sinks, under an alternative embodiment.

FIG. 11A is a top perspective view of a device 700 that includes dual heat sinks, under an alternative embodiment. The device is encapsulated in a compound 760 and includes, among other components, a top heat sink 750, as described above with reference to FIG. 7 and FIG. 10.

Figure 11B:
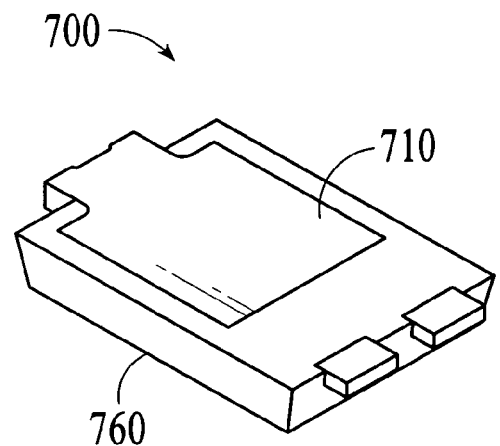
FIG. 11B is a bottom perspective view of a device that includes dual heat sinks, under an alternative embodiment.

FIG. 11B is a bottom perspective view of a device 700 that includes dual heat sinks, under an alternative embodiment. The device is encapsulated in a compound 760 and includes, among other components, a bottom heat sink 710, as described above with reference to FIG. 7 and FIG. 10.

Figure 12:
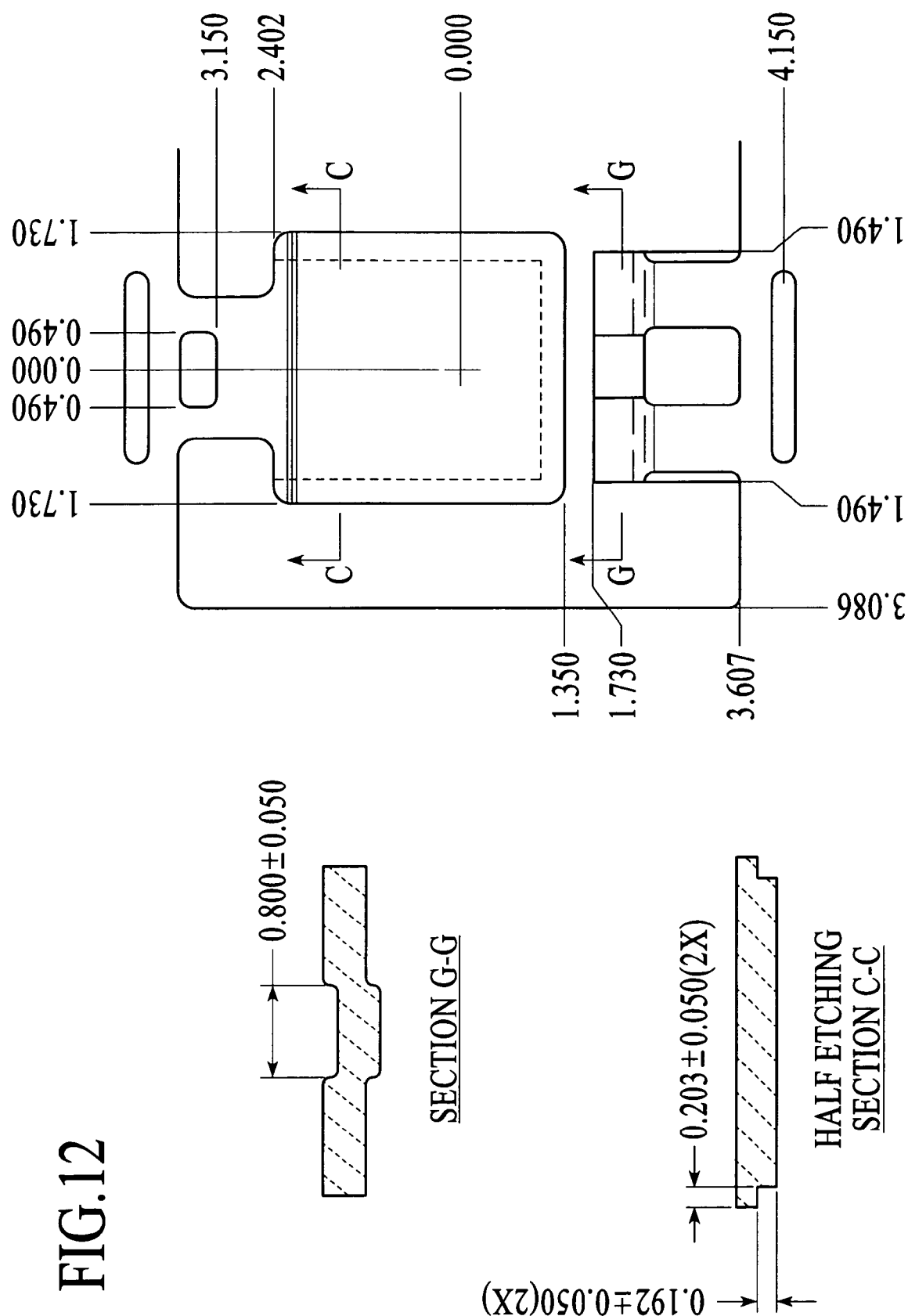
FIG. 12 is a schematic of a portion of a lead frame/conductive mounting platform (bottom heat sink), under an embodiment.
Figure 13:
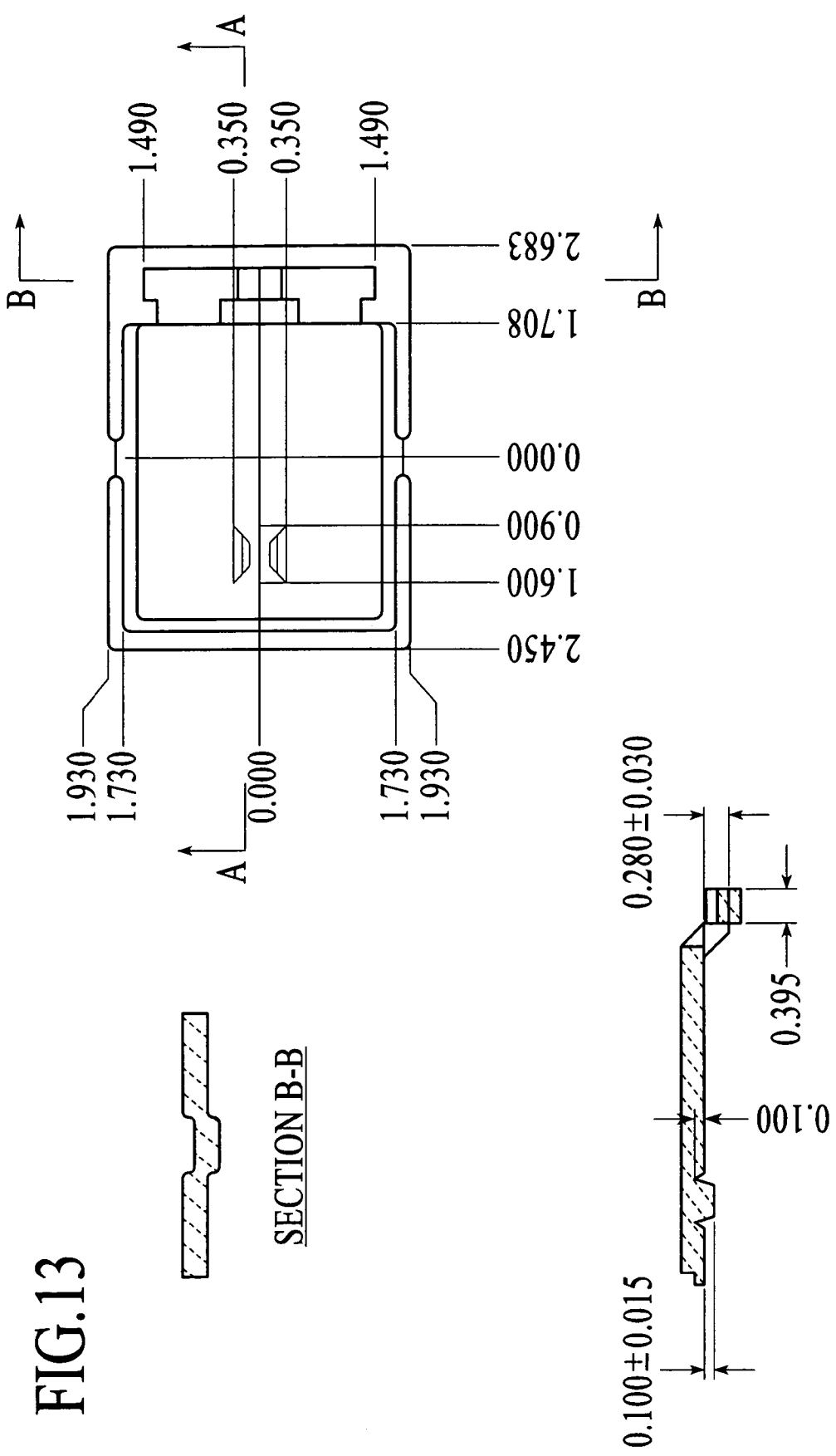
FIG. 13 is a schematic of a portion of a conductive clip (top heat sink), under an embodiment.
Figure 14:
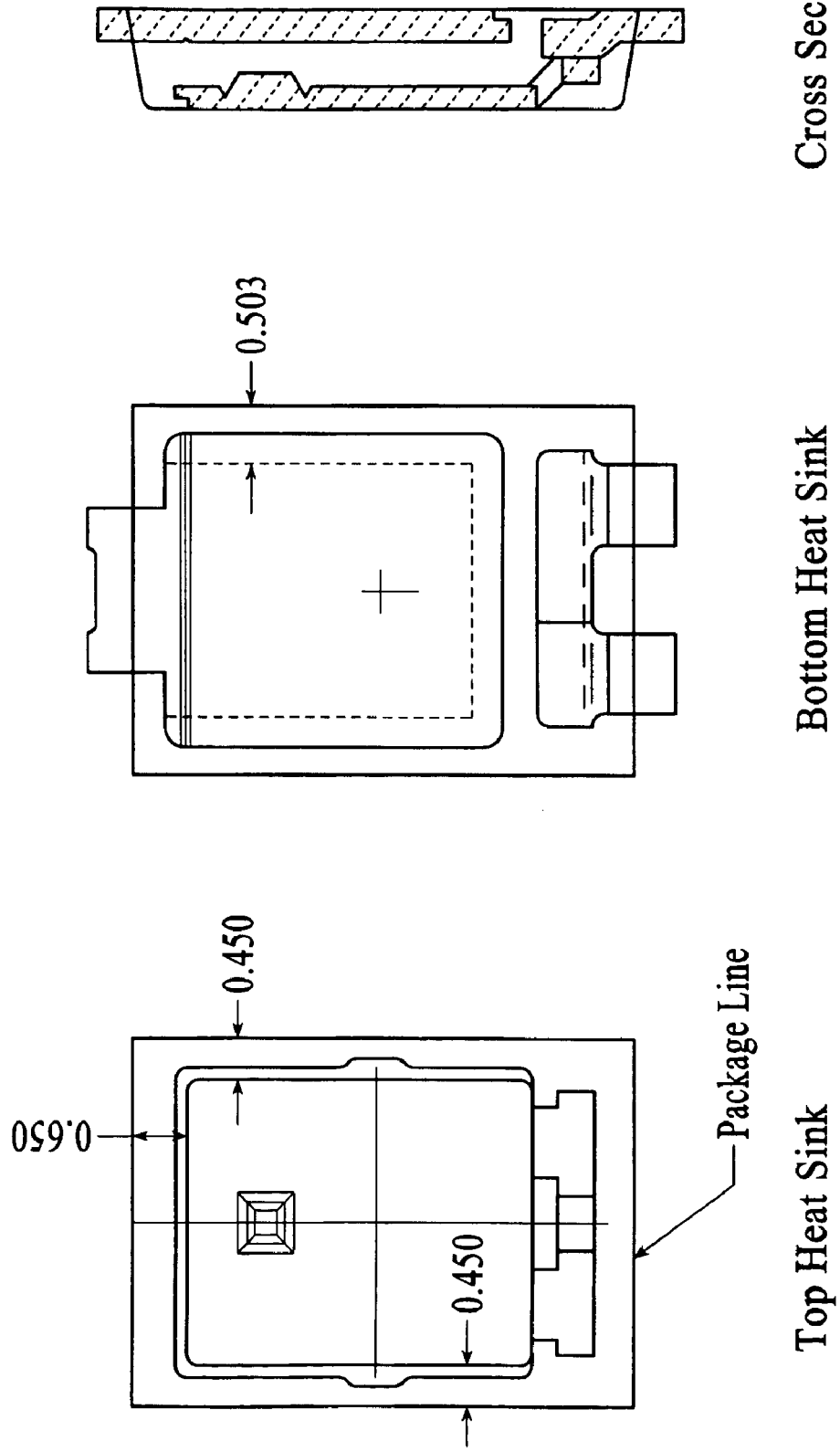
FIG. 14 is a schematic showing the semiconductor package or device line relative to each of the top heat sink and bottom heat sink, under an embodiment.

FIG. 12 is a schematic of a portion of a lead frame/conductive mounting platform (bottom heat sink), under an embodiment. FIG. 13 is a schematic of a portion of a conductive clip (top heat sink), under an embodiment. FIG. 14 is a schematic showing the semiconductor package or device line relative to each of the top heat sink and bottom heat sink, under an embodiment. These schematics include dimensions (e.g., millimeters) of an example embodiment, however these dimensions do not limit the embodiments described herein to these exact dimensions as alternative embodiments can use different dimensions as appropriate to a specific semiconductor package design.

The semiconductor devices and processes of embodiments described herein can be used with systems like those described in one or more of U.S. patent application Ser. No. 11/048,460, filed Jan. 31, 2005, and U.S. patent application Ser. No. 11/048,461, filed Jan. 31, 2005.

All publications and patent applications mentioned in this specification are herein incorporated by reference to the same extent as if each individual publication or patent application was specifically and individually indicated to be incorporated by reference.

Aspects of the semiconductor devices and processes including multiple heat sinks described above can be used in any of a variety of electronic components. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above descriptions are not intended to be exhaustive or to limit the disclosed embodiments to the precise forms disclosed. While specific embodiments of, and examples for, the semiconductor device including multiple heat sinks and the corresponding assembly processes are described herein for illustrative purposes, various equivalent modifications are possible within the scope of the description, as those skilled in the relevant art will recognize. The teachings provided herein can be applied to other manufacturing systems, not only for the semiconductor devices and processes described above.

The elements and acts of the various embodiments described above can be combined to provide further embodiments. These and other changes can be made to the semiconductor devices and processes in light of the above detailed description.

What is claimed is:

1. A semiconductor device comprising:
    a lead frame that includes a conductive mounting platform, the conductive mounting platform configured as a first heat sink of a semiconductor package, the mounting platform being configured as a continuous surface;
    a semiconductor die having a first side that couples to the conductive mounting platform, such that the first side is completely covered by the conductive mounting platform; and
    a conductive clip coupled to a second side of the semiconductor die such that the second side is completely covered by the conductive clip, wherein the conductive clip is coupled to opposite sides of the lead frame, the conductive clip configured as a second heat sink of the semiconductor package, a side of the conductive clip opposite the second side of the semiconductor die being at least partially exposed, and, wherein when the package is assembled, the semiconductor die is enclosed by the first heat sink, the second heat sink and an encapsulating compound.

2. The device of claim 1, further comprising an enclosure that encloses at least one portion of each of the conductive mounting platform, the semiconductor die, and the conductive clip.

3. The device of claim 2, wherein an area of a bottom side of the first heat sink is exposed through the enclosure.

4. The device of claim 2, wherein an area of a top side of the second heat sink is exposed through the enclosure.

5. The device of claim 1, further comprising a first indentation in an exterior surface of the conductive mounting platform, wherein the first indentation is a notch in at least a portion of at least one edge of the conductive mounting platform.

6. The device of claim 5, further comprising an enclosure that connects to at least one area of the first indentation, wherein the first indentation engages the enclosure and secures the enclosure to the conductive mounting platform.

7. The device of claim 1, further comprising a second indentation in an exterior surface of the conductive clip, wherein the second indentation is a notch in at least a portion of at least one edge of the conductive clip.

8. The device of claim 7, further comprising an enclosure that connects to at least one area of the second indentation, wherein the second indentation engages the enclosure and secures the enclosure to the conductive clip.

9. The device of claim 1, wherein the semiconductor device is a surface-mount discrete power device.

10. A semiconductor device comprising:
    a lead frame that includes a conductive mounting platform that is coupled to a first side of a die so as to completely cover the first side of the die, and is a first heat sink for the die, the platform being configured as a continuous surface;
    a conductive clip that is coupled to a second side of the die so as to completely cover the second side of the die, and is a second heat sink for the die, the conductive clip coupled to opposite sides of the lead frame, a side of the conductive clip opposite the second side of the semiconductor die being at least partially exposed, and;
    an enclosure that connects to a first indentation in the conductive mounting platform and a second indentation in the conductive clip, wherein the lead frame, the conductive clip and the enclosure comprise a semiconductor die package such that the die is enclosed by the first heat sink, the second heat sink and an encapsulating compound.

11. The device of claim 10, wherein the first indentation is in an exterior surface of the conductive mounting platform, wherein the first indentation is a notch in at least a portion of at least one edge of the conductive mounting platform.

12. The device of claim 11, wherein the enclosure connects to at least one area of the first indentation, wherein the first indentation engages the enclosure and secures a portion of the enclosure to the conductive mounting platform.

13. The device of claim 10, wherein the second indentation is in an exterior surface of the conductive clip, wherein the second indentation is a notch in at least a portion of at least one edge of the conductive clip.

14. The device of claim 13, wherein the enclosure connects to at least one area of the second indentation, wherein the second indentation engages the enclosure and secures a portion of the enclosure to the conductive clip.

* * * * *